US006208954B1

(12) United States Patent
Houtchens

(10) Patent No.: US 6,208,954 B1
(45) Date of Patent: Mar. 27, 2001

(54) METHOD FOR SCHEDULING EVENT SEQUENCES

(75) Inventor: Steven P. Houtchens, Mountain View, CA (US)

(73) Assignee: Wind River Systems, Inc., Alameda, CA (US)

(*) Notice: Subject to any disclaimer, the term of this patent is extended or adjusted under 35 U.S.C. 154(b) by 0 days.

(21) Appl. No.: 08/307,178

(22) Filed: Sep. 16, 1994

(51) Int. Cl.[7] .................................................... G06F 17/50
(52) U.S. Cl. ............................... 703/16; 703/17; 703/20
(58) Field of Search ............................. 364/578, 228.3, 364/229.3, 232.3, 270, DIG. 1; 395/500, 800; 703/16, 17, 20, 26

(56) References Cited

U.S. PATENT DOCUMENTS

| | | | |
|---|---|---|---|
| 4,123,794 | * 10/1978 | Matsumoto | 364/132 |
| 4,306,286 | * 12/1981 | Cocke et al. | 395/800 |
| 4,351,025 | * 9/1982 | Hall, Jr. | 395/500 |
| 4,468,734 | * 8/1984 | Lanier et al. | 395/182.02 |
| 4,733,347 | * 3/1988 | Fukuoka | 395/650 |
| 4,744,084 | * 5/1988 | Beck et al. | 371/23 |
| 4,814,983 | * 3/1989 | Catlin | 395/500 |
| 4,872,125 | * 10/1989 | Catlin | 364/578 |
| 4,916,647 | * 4/1990 | Catlin | 364/578 |
| 5,051,938 | * 9/1991 | Hyduke | 364/578 |
| 5,081,601 | * 1/1992 | Eirikasson | 364/578 |
| 5,095,454 | * 3/1992 | Huang | 364/578 |
| 5,247,650 | * 9/1993 | Judd et al. | 395/500 |
| 5,272,651 | * 12/1993 | Bush et al. | 364/578 |

* cited by examiner

Primary Examiner—Kevin J. Teska
Assistant Examiner—Thai Phan
(74) Attorney, Agent, or Firm—Pennie & Edmonds LLP

(57) ABSTRACT

A method and apparatus for sequencing the execution of a simulation system comprising at least two subsystem simulators. The simulation system further comprises a first and second simulator, a processor for executing program instructions of a control program stored in a memory coupled to the processor, a router for coupling first simulator inputs and outputs to second simulator outputs and inputs respectively, and an input device including a control and monitor panel for controlling said sequencing. The control program controls a plurality of subsystem simulators and comprises an initiation sequence for initiating execution of a first simulator at an initiation time including defining a first simulator output state, a first execution sequence wherein said first simulator executes a simulation and updates first simulator outputs to said second simulator, a first halt sequence for halting said first execution sequence, a first transfer sequence for transferring first simulator output data to said second simulator inputs, a second execution sequence wherein said second simulator executes a simulation after said first simulator execution has halted, a second halt sequence for halting said second execution sequence at a second halt time equal to the earlier of said first halt time and a change in state of said second simulator outputs, a repeat sequence for restarting said first execution sequence to run until a final simulation time is reached, and a back-up sequence for restarting the first execution sequence at a last verified simulation time.

18 Claims, 4 Drawing Sheets

METHOD FOR SCHEDULING EVENT SEQUENCES

The present invention relates to simulation and testing of combinations hardware, electronics and software systems, and in particular to a system for coordinating simulation execution of different subsystem models within an overall system model.

BACKGROUND OF THE INVENTION

When a new system is designed that involves electronics, computers and physical apparatus, it is commonplace now for complex systems to model the prototypical designs using simulation software, to resolve design flaws and generally to improve the system before it is implemented. When such a system includes subsystems of different fundamental types, such as an electronic system coupled with a physical system, each of the subsystems is in conventional approaches modeled independently. This arises in many fields, such as in the design of new automobiles, to name one example. In general, any system that includes at least two of the three categories of subsystems named will have a separate simulation program for each category.

In real implementations of the design, the subsystems interact with and affect one another. The electronics system, on-board computer (and control programs) and physical subsystems (steering, brakes, etc.) of an automobile, for instance, cannot be developed independently of one another, but their relationships and interactions must be analyzed. Thus, it would be useful if the simulation programs for these different subsystems could similarly communicate and interact, to determine the effects that are likely to occur in the final product. Conventionally, simulators created to assist in the design of such subsystems 5 lack this interactiveness.

SUMMARY OF THE INVENTION

A method and apparatus for sequencing the execution of a simulation system comprising at least two subsystem simulators. The simulation system further comprises a first and second simulator, a processor for executing program instructions of a control program stored in a memory coupled to the processor, a router for coupling first simulator inputs and outputs to second simulator outputs and inputs respectively, and an input device including a control and monitor panel for controlling said sequencing. The control program controls a plurality of subsystem simulators and comprises an initiation sequence for initiating execution of a first simulator at an initiation time including defining a first simulator output state, a first execution sequence wherein said first simulator executes a simulation and updates first simulator outputs to said second simulator, means for halting said first execution sequence, a first transfer sequence for transferring first simulator output data to said second simulator inputs, a second execution sequence wherein said second simulator executes a simulation after said first simulator execution has halted, means for halting said second execution sequence at a second halt time equal to the earlier of said first halt time and a change in state of said second simulator outputs, a repeat sequence for restarting said first execution sequence to run until a final simulation time is reached, and a back-up sequence for restarting the first execution sequence at a last verified simulation time.

DESCRIPTION OF THE PREFERRED EMBODIMENTS

The present invention is directed to the simulation of the operation of a physical system interacting with an electronic system, for modeling the design of such systems before actually building them. Conventional electronic and physical system simulators may be used, with some modifications as described below, and their simulation processes are coordinated and controlled by the scheduling method of this invention. In general, the system of the invention may be applied to any two processes that must be synchronized, where a first process moves ahead of the second and may back up if the information or outputs of the second process change.

Figure 1:
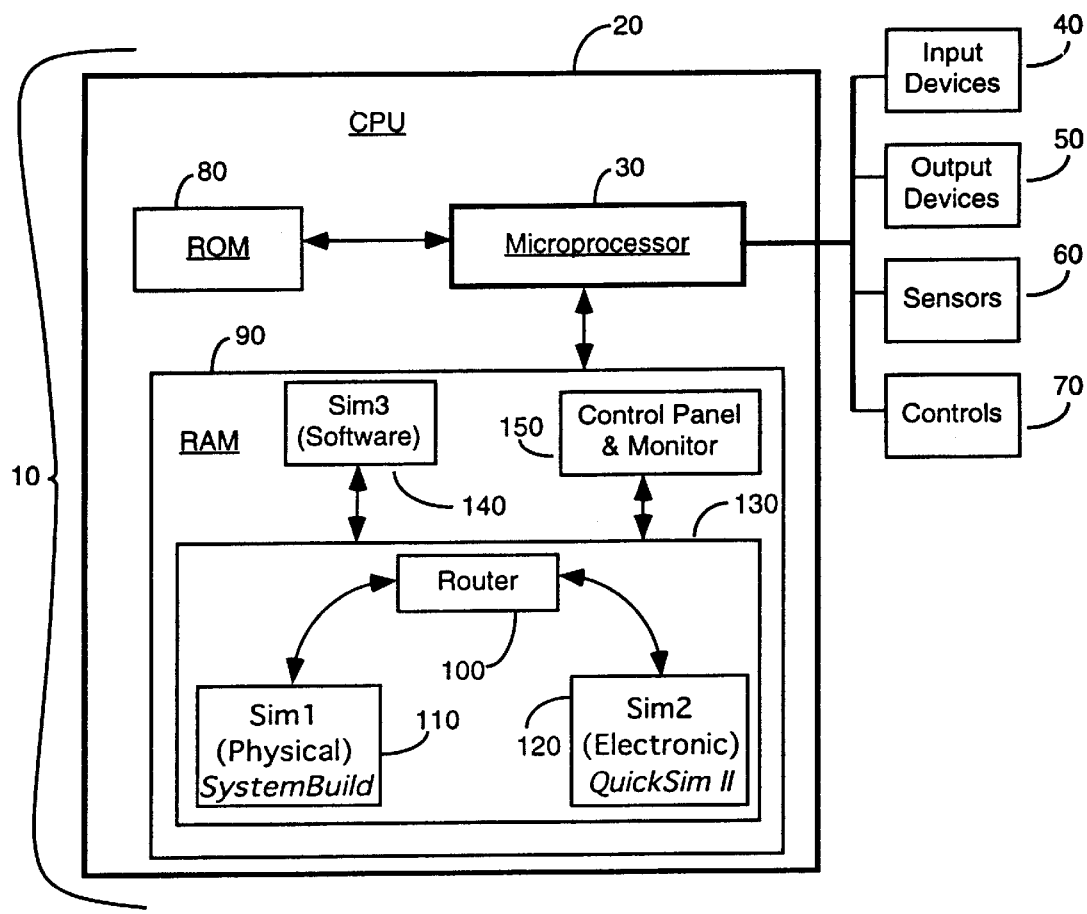
FIG. 1 is a block diagram of a system for implementing the invention.

The method of the invention can be implemented in a program stored as code in a computer memory. FIG. 1 shows a system 10 including a central processing unit (CPU) 20 including a microprocessor 30 coupled to input devices 40, output devices 50, sensors 60, and control output interface 70. The input devices may be user input devices (such as a keyboard) or input hardware from other sources. The output devices will typically be monitors, printers and the like. Sensors 60 are devices for sensing the physical state of a system and sending data representative thereof to the microprocessor. The control interface 70 transmits commands and data from the microprocessor to physical controls for hardware. Each of the foregoing devices 40–70 may be any of many conventional devices that are commercially available for control of physical systems.

The CPU 20 includes a read-only memory (ROM) 80 and a random access memory (RAM) 90 coupled to the microprocessor 30. The RAM 90 stores a program including instructions for the microprocessor 30 for executing the method of the invention, this program including modules shown in FIG. 1: a router 100, a physical system simulator Sim1 (110), and an electronic system simulator Sim2 (120). See FIGS. 1 and 2. The modules 100–120 govern different processes in a program implementing the functions of the invention. Modules 100–120 together may be referred to as a controller model of the system to be modeled. In the following description, the terms "process", "simulator" and "module" will be used as appropriate in conjunction with the modules 100–140, depending upon context, and should be understood as referring to the process carried out by the particular module in question, the simulator (e.g. electronic simulator or physical simulator) represented by the module in question, or the software module, respectively.

Module 140 (Sim3) is a software module representing a software simulation process that interacts with modules 110 and 120. In the simulation of an entire system under design, the physical, electronic and software components would all be modeled by these respective system modules, and the modules communicate in a conventional fashion in most respects, with the exception of the new features (including the router 100) discussed herein. Thus, the software module 140 may be of conventional design in the field of modeling systems.

Figure 3:
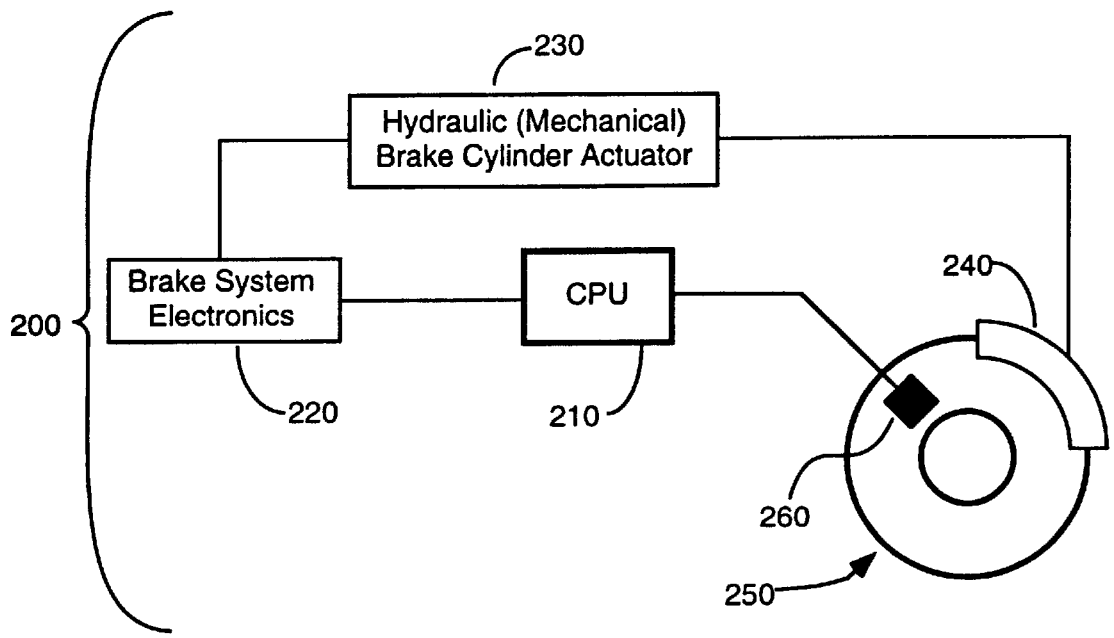
FIG. 3 illustrates a brake system in connection with which the system of the invention may be used.

The system 10 can be used in many different actual settings. For example, an automobile manufacturer will typically design a new automobile by modeling it in a computer program. The model will have many subsystems, and each subsystem will typically have three components: a mechanical component, an electronic component, and a computer control (program) component. This is illustrated in FIG. 3, which shows part of an anti-brake-locking system (ABS) 200, which itself is a subsystem of a complete braking system (not shown), which in turn is a subsystem of the entire automobile (also not shown).

The ABS system 200 is thus a design that might be modeled by a system of the present invention, and for this example includes: a conventional CPU 210 having the necessary memories and a program for controlling the ABS system; brake system electronics 220 coupled to the CPU 210; a braking actuator unit 230 controlled by the electronics 220 (and, indirectly, by the computer 210); brake pads or calipers 240 controlled by the actuator unit 230; a brake disk 250 that rotates with the automobile wheel (not shown); and a rotation sensor 260 that senses the rate of rotation of the disk 250. The ABS system 200 may be any system that is under design and needs to be modeled and simulated in software; the particular system is not important to the present invention, and could be any system to be modeled that has an electronic component and a physical component. In this example, the physical module 110 would include a representation of the physical components of the ABS system 200, including the hydraulic system with its actuator 230, and brake components and sensor 240–260. The electronic module 120 would include a simulator representation of the brake system electronics, and the software module 140 would include a representation of the control software of the ABS system 200, which resides in a memory (not shown) of the CPU 210.

The present invention is directed particularly to modifications to the physical and electronics modules 110 and 120 over conventional design, and to their interactions via the router 100. Other than as described below, their interactions with the software module 140 is standard, and thus the software module 140 will not be discussed in detail herein.

The physical module 110 can be generated using the commercially available application SystemBuild by Integrated Systems, Inc., and the electronics module can be generated using the commercially available QuickSim II tools by Mentor Graphics. The present invention enhances the capabilities of these otherwise standard applications with interprocess communications (IPC) capability, creating an IPC mechanism and designing a control panel/monitor to provide the user with a centralized simulation-time interface for the integrated simulation environment.

Following are short descriptions of aspects of the preferred implementation of the invention, followed by a detailed description of the method of the invention.

Modeling Procedure

As noted above, the overall closed-loop model of the system to be controlled and the controller are partitioned into two subsystems, the physical (SystemBuild, or SB) subsystem and the electronic subsystem, which may also be referred to as the VHDL (or Visic Hardware Description Language) subsystem, which will run on SystemBuild and QuickSim II simulators, respectively. The portion of the model to be simulated by SystemBuild tool can be defined using the SystemBuild user interface called SystemBuild editor. The user creates a black box description for the VHDL subsystem inside the SystemBuild editor by including a predefined SystemBuild icon, referred to as the VHDL block. The user generates a VHDL description of his/her VHDL subsystem and simulates it with QuickSim II simulator. It will be understood that other commercial or known simulators may equivalently be used.

Integrated Simulation Interface

The integrated simulation environment preferably has a centralized control panel/monitor 150, such that the user can control and monitor both simulators 110 and 120 within this process 150. Proper functionality for starting and stopping both simulators 110 and 120, and for observing the communication between the processes, should be incorporated.

Architecture: Process Functions

FIG. 1 shows the architecture of the system of the invention, which includes four processes, namely the processes 100–120 and a control process and monitor 150. The messages between the two simulator processes will be passed through the router 100 following an IPC protocol. The router acts as the server process and the two simulators act as the client processes.

This architecture will allow any process to run on any machine attached to the Internet network, hence providing the capability of performing distributed computation using multiple processors concurrently.

It would also be possible to define the electronic subsystem 120 as a VHDL block in the SystemBuild (physical) subsystem 110; in this case, the VHDL block would be a place holder to facilitate the definition of inputs and outputs between the VHDL and the SB subsystems, and thus would represent communication with the QuickSim II simulation environment. (Functionally, the results will be the same as when the subsystems are separate, as in FIG. 1.) The shared inputs and outputs between the two simulator modules 110 and 120 would be defined by the information entered in the VHDL block in the SystemBuild editor.

In this embodiment, the VHDL block inside the SystemBuild editor would require the user to enter the number of inputs, to the VHDL block and number of outputs from the VHDL block. The VHDL model to be loaded on QuickSim II similarly should include information detailing number of inputs and outputs of the VHDL subsystem. It will be left to the user to make the number and names of the input/output points equivalent in both the SB and VHDL subsystems.

The number of inputs and outputs and the names along with the types of these signals in the VHDL model should match those entered in the SystemBuild model. In case of a mismatch between the input/output configurations reported by the two simulators, the simulators preferably abort the simulation session by sending proper error messages to each other and to the user via the control panel.

During the initialization phase, as discussed in greater detail below, the two simulators exchange information concerning the number of inputs and outputs, names, types and initial values of the signals along with the simulation duration and the units of time. During the course of co-simulation, the physical simulator module 110 preferably takes as inputs integer/logical data types represented by 64 bits of accuracy in signed magnitude form.

Simulator Intercommunication

Figure 2:
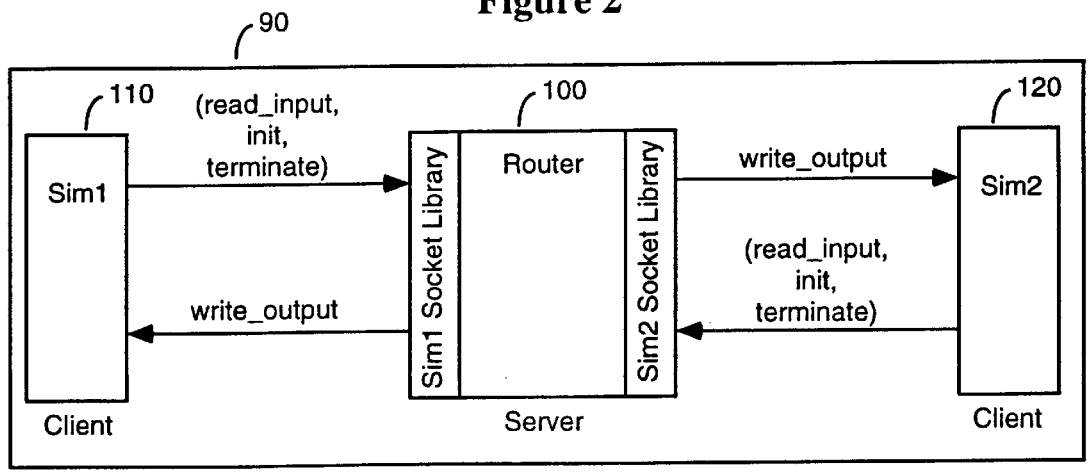
FIG. 2 is a block diagram of detail of a router and simulator processes of the invention.

The physical and electronic processes 110 and 120 run as independent processes that communicate with each other through the IPC mechanism mentioned above, which preferably employs UNIX system sockets, as illustrated in FIG. 2. The router 100 is a stand-alone process, and manages the IPC. The router 100 has two main functions: routing the messages, and performing format conversion on the messages when necessary.

Both simulators 110 and 120 initially register with the router 100 and send and receive messages via the router. The simulators 110 and 120 employ their own C-function libraries, which in turn employ UNIX system sockets to communicate with the router. This makes it possible both to keep the modification to the SystemBuild simulator to minimum, and also to utilize the IPC Package already available for the QuickSim II simulator.

It will be understood that, while the above is the preferred embodiment for the invention, other operating systems, programming languages and commercial applications may be used in place of those discussed.

Protocol

Asynchronously sent messages form the basis of the communication protocol, with all messages being sent through the router process 100 and with appropriate format conversion being performed by the Router. An asynchronous message sent from the physical process 110 to the electronic process 120 via the router 100 is reformatted by the router and then passed along. Such a message should have the following semantics:

- units_of_time: units of the real number representing time, e.g., milliseconds or microseconds. (This information is sent once only, during initialization phase.)
- duration_of_simulation: length of the simulation. (This information is sent once only, during initialization phase.)
- message_type: type of the message, e.g., initialization, acknowledgment, output posting, current simulation time posting, last verified simulation time posting, simulation state control messages (pause, resume, rerun, and exit).
- signal_name: name of a signal crossing the VHDL and the SB subsystem boundaries.
- signal_value: either integer or binary number.
- signal_type: either integer or logical quantity.
- signal_time: time of change in the signal value.
- signal_source: name of the process originating the message. (This information is employed by the router.)
- signal_destination: name of the process to receive the message. (This information is employed by the router.)

A set of functions that make it possible for the physical simulator 110 to communicate with the router 100 using proposed message semantics are defined in Appendix A. These functions include the following (for others, see Appendix A):

- rti_init(): this function establishes a socket connection to the Router
- rti_write_output(): sends a message to a designated process via the Router
- rti_read_input(): retrieves a message from another process via the Router
- rti_terminate(): closes the socket connection to the Router Appendix A also lists soc_link.* files, along with a specification of library functions.

The functions and files listed in Appendix A serve as a guide to the functions that may be used to implement the present invention. Other formulations of functions may be reasonable for particular applications.

The semantics of messages sent to the physical process 110 from either the control panel 150 or the electronic simulator 120 via the router 100 are preferably defined as follows:

Initialization data from simulator 120 to simulator 110:
message_type,
units_of_time,
duration_of_simulation,
signal_name,
signal_type,
signal_value Output posting data from simulator 120 to simulator 110:
message_type,
signal_name,
signal_value,
signal_type,
  signal_time Control data from simulator 120 to simulator 110:
pause (equivalently stop in QuickSim II semantics)
  resume
rerun (equivalently reset and run in QuickSim II semantics)
exit (terminate execution of the SystemBuild simulator executable)

Appendix B is a C-language source code listing for a preferred implementation of an IPC router for use with the invention. It is one example of how the router may be realized, and many other specific embodiments are possible.

User Interface

In the preferred embodiment utilizing a SystemBuild simulator for the physical system simulation, the user interface is via a shell script that will invoke the executable for the SystemBuild simulator. The user provides the name of the file that holds the SB subsystem, the name of the top-level superblock, the name of the file that holds the time vector and external input vector, if applicable, and the name of the file where outputs will be stored.

Upon invocation of the executable, the SystemBuild simulator enters the run mode after successfully going through the initialization phase and registering with the router. The user is then able to control the flow of System-Build simulation by sending messages to SystemBuild simulator from the Control Panel/Monitor via the QuickSim II simulator and the router. The set of actions that may be requested by the user from the SystemBuild simulator should include exit, pause, resume, and rerun.

These features are preferred in the user interface, though variations are certainly acceptable, and this particular interface is not necessary to practice the scheduler system of the invention. The creation of such an interface is routine for users of such applications as SystemBuild and QuickSim II, or other simulation applications.

Initialization

The SystemBuild simulator 110 will enter the initialization phase upon invocation of the executable for the co-simulation session. After registering as a client process with the router 100, the SystemBuild simulator 110 will first exchange initialization information with the QuickSim II simulator 120 and request that the QuickSim simulator acknowledge the successful termination of the initialization phase. Upon acknowledgment from the QuickSim simulator 120, the SystemBuild simulator 110 will proceed with the normal execution of the simulation.

The content of data exchanged during the initialization phase will include the number of inputs/outputs, signal names, signal types, duration of the simulation and units of time. Any discrepancy detected preferably generates error messages to be sent to the user and to the other process, and the co-simulation session is aborted by both simulators.

The method of the invention
Synchronization: general considerations.

The method of the invention acts as a process scheduler, to synchronize the actions taken by each of the two simulators. The first of the simulations, the SystemBuild simulation, proceeds forward in time as soon as the initialization phase is complete, and starts to integrate the model dynamics. The integration step size is defined by: (1) a set of parameters, some of which are user controllable, and (2) the type of integration algorithm used (fixed step size or variable step size).

After model dynamics are integrated forward to the time implied by the integration step size, the SystemBuild simulator computes the outputs of the SB subsystem, and posts any outputs that have changed since the last time they were computed. (In fact, both simulators will post their outputs to one another whenever there is a change in a subset of the overall output signals; however, the VHDL subsystem outputs are potentially able to change much faster in comparison to a change in SB subsystem outputs. As a general matter, the method of the invention is applicable to systems where one simulator is faster than the other, and the two must be coordinated in time.)

Even if no SB subsystem outputs have changed, the SystemBuild simulator will nonetheless post its current simulation time to the QuickSim II simulator after each integration step, in order to establish synchronization. Additionally, the SystemBuild simulator will post its last verified simulation time whenever its value is updated. The last verified simulation time is the time in SystemBuild simulation history to which SystemBuild can back up, to if necessary.

The SystemBuild simulator then determines whether any inputs are reported by the QuickSim II simulator. If new, valid inputs are reported, they are processed. If no new, valid input is reported by the QuickSim II simulator, the SystemBuild simulator will use the most recently reported values from the QuickSim II simulator.

The method of the invention takes as given that the SystemBuild simulator cannot back up past the last verified simulation time, and consequently that all QuickSim II outputs up to the last verified simulation time have been processed by SystemBuild simulator. Hence, the inequalities given by:

(1) QuickSim II current simulation time≧SystemBuild last verified simulation time and (2) SystemBuild last verified simulation time≦SystemBuild current simulation time are implied by the definition of the "last verified simulation time".

The method also takes it as given that the QuickSim II simulator cannot back up in time, and therefore the QuickSim II current simulation time will never exceed the SystemBuild current simulation time during the course of simulation. The following inequality is established by this observation:

(3) QuickSim II current simulation time≦SystemBuild current simulation time

Combining the inequalities given by 1, 2 and 3 above yields the following forward-moving and variable length time window for simulation synchronization:

(4) SB last verified sim time
≦QuickSim II current sim time
≦SB current sim time The QuickSim II simulator can move to the next event if and only if:

(I) SystemBuild last verified simulation time is equal to QuickSim II current simulation time;

(II) QuickSim II has received outputs of SB subsystem evaluated at the current simulation time; and (III) SystemBuild current simulation time is greater than QuickSim II current simulation time.

Condition I ensures that the SystemBuild simulator will not back up past the current simulation time of QuickSim II, and therefore is not likely to generate new outputs to be processed by QuickSim II that would require QuickSim II to back up. Condition II ensures that new outputs likely to be generated at the current simulation time will be taken into account by the QuickSim II simulator before it moves to the next point, hence eliminating the need for QuickSim II to back up. Condition III ensures that inequality 3 above is observed.

Most dynamic (physical) systems have a settling time on the order of milliseconds or longer, although some dynamic systems (such as the reader arm positioning mechanism of a hard drive) might have settling times on the order of tens of milliseconds. Typical electronic circuit hardware, on the other hand, is likely to have response times on the order of nano- to microseconds.

Therefore, the response/settling time of the plant dynamics will be the determining factor for the closed loop response time.

This observation indicates that the SB subsystem will not be able to respond to changes in its inputs signals whose frequency of change is higher than the highest frequency response of the plant dynamics. This fact can be used to define a lower bound for two consecutive time points on the SystemBuild simulator time line—i.e., a minimum step size for the integration algorithm—given that all other requirement to define the step size are satisfied. The goal is to prevent SystemBuild simulator integration algorithms from taking unnecessarily small step sizes.

It is possible that variable step integration algorithms in SystemBuild can take very large time steps without computing the output. If $t_n$ is the last time at which two simulators synchronized, and if $t_{n+1}-t_n$ is very large, then the QuickSim II simulator will have to wait until SystemBuild attempts to synchronize with QuickSim II at time point $t_{n+1}$. If the wait by the QuickSim II is likely to become too long, it is possible to limit the integration step size in SystemBuild (by a DTMAX (Δt maximum) parameter, which can be set by the user, to control the maximum step size for the integration algorithm).

Synchronization: application to a specific example.

FIGS. 4–10 are graphical representations of the method of the invention as applied to the above example of a physical simulator interacting with an electronic simulator, as would be the case if the ABS system of FIG. 3 were to be simulated. These figures will be discussed in light of the following pseudocode for the simulation flow for the SystemBuild simulator (i.e. the physical simulator in this embodiment):

A1. Initialize; last verified simulation time=initial simulation time; and current simulation time=initial simulation time.

A2. Compute the integration step size and move the dynamics forward in time accordingly.

A3. Compute the outputs.

A4. Update current simulation time.

A5. Post current simulation time to QuickSim II.

A6. If outputs changed compared to the most recent time point, then:
post the outputs.

A7. Check to see if new inputs from QuickSim II are available.

A8. If new inputs are available, then:
   If new inputs are older than current simulation time, then:
   (a) store new inputs;
   (b) schedule the time associated with those inputs as output evaluation time;
   (c) rewind current simulation time to last verified simulation time;
   (d) integrate dynamics forward in time to the point QuickSim II outputs posted;
   (e) move last verified simulation time forward to current simulation time;
   (f) store the state of the SystemBuild simulator; and
   (g) post the last verified simulation time to QuickSim II.
   If time lag for new inputs is equal to current simulation time, then:
   (h) advance last verified simulation time to current simulation time;
   (i) post the last verified simulation time to QuickSim II;
   (j) store the state of the SystemBuild simulator; and
   (k) apply the new input to the system.
A9. Check to see if final simulation time is reached.
A10. If final simulation time is not reached, then:
   Go to step A2.
A11. Exit.

Pseudocode for the simulation flow for the QuickSim II (electronic) simulator is as follows:

B1. Initialize;
   current simulation time=initial simulation time; and
   last verified simulation time=initial simulation time.
B2. Wait until SystemBuild last verified simulation time is equal to QuickSim II current simulation time and SystemBuild reports a current simulation time later than QuickSim II current simulation time.
B3. Schedule SystemBuild output evaluation time as QuickSim II event time.
B4. Move forward in time to the next QuickSim II internal event or SystemBuild event, whichever comes first.
B5. Update current simulation time.
B6. Post the current simulation time to SystemBuild.
B7. If outputs have changed, then: post the outputs and event time to SystemBuild simulator.
B8. If final simulation time is not reached, then: Go to step B2.
B9. Exit.

Figure 4:
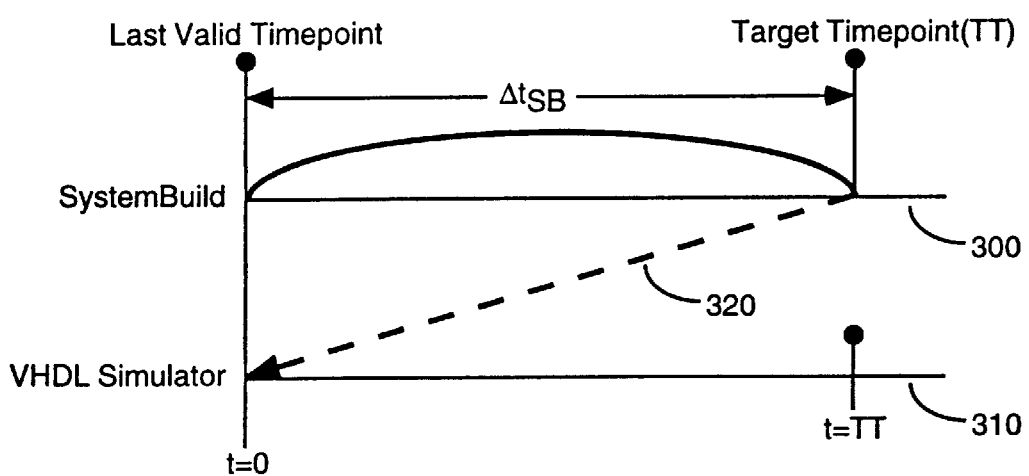
FIGS. 4–10 are timing diagrams illustrating the operation of the invention.

In FIG. 4, the time line 300 represents actions taken by the first of the processes, i.e. the physical process of SystemBuild (SB). Time line 310 represents actions taken by the second of the process, in this example the electronic process expressed as a VHDL simulator.

At t=0, the SB and VHDL simulators are initialized. In the SB simulator, this includes setting the last verified simulation time to the initial simulation time (i.e. t=0, here), and also setting the current simulation time to the initial simulation time (t=0). The same is done in the VHDL simulator; see steps A1 and B1 in the pseudocode above.

Step A2 is now executed, with the SB simulator computing the integration step side (see discussion in previous section), which yields the time step $\Delta t_{SB}$ (see FIG. 4) for which the SB simulator must now calculate is new outputs. This is represented in FIG. 4 as the target timepoint, or TT.

Note that at this point, the "last valid timepoint" (the last time at which the two simulators are synchronized with one another, i.e. at the same time point in their simulation execution and caught up on one another's output values) is time t=0.

In practice, the integration step size $\Delta t_{SB}$ may comprise one to many (e.g. a hundred or more) individual time steps. However, the representation in FIG. 4 is of a single step, the assumption in for this example being that the SB outputs have not changed for the entire step $\Delta t_{SB}$.

Step B2 is carried out simultaneously with step A2, and causes the VHDL at this point to wait until the current VHDL (i.e. QuickSim II) simulation time is the same as the last verified simulation time of the SB simulator and the SB simulator reports a current simulation time later than the current simulation time for the VHDL simulator. In practice, this means that the VHDL simulator will wait until the SB simulator reaches time TT (see FIG. 4) before executing its own simulation.

At step A3, the outputs up to time TT are computed by the SB simulator, and at step A4 the current simulation time is updated. This is then posted to the VHDL simulator (step A5). Arrow 320 in FIG. 4 represents the posting of the current simulation time pursuant to step A5, indicating that the target timepoint has been reached.

Figure 5:
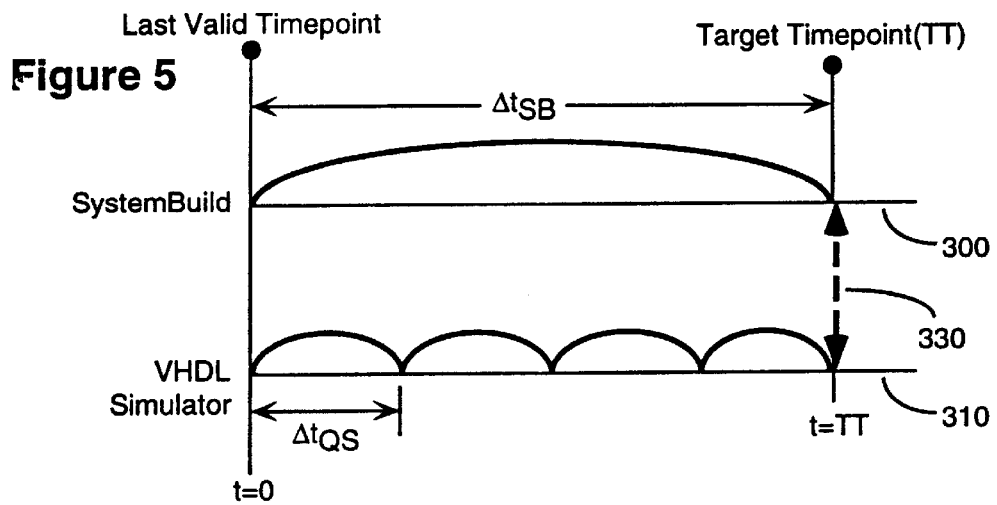

The VHDL simulator is now free to act. Thus, at step B3, the time TT is scheduled as the next VHDL event time, and at step B4 the VHDL simulator moves forward to the next VHDL event or SB event, whichever comes first. In practice, this will usually be an update to the next time step (a step of $\Delta t_{QS}$, as shown in FIG. 5) for the QuickSim II simulator, which will generally be considerably smaller than $\Delta t_{SB\ for}$ instance, Atos may be 1. nanosecond, while $\Delta t_{SB}$ may be 1 millisecond. The actual individual steps sizes for the SystemBuild may, as indicated above, be much smaller than $\Delta t_{SB}$; e.g., if $\Delta t_{SB}$ is 1 millisecond (0.001 sec.), the individual SB step sizes may be 0.01 to 0.1 millisecond. A typical time for an entire simulation run will typically be many times the amount of time represented by the target time TT; the latter may be 1 millisecond, for instance, while the former is 10–100 milliseconds.

At step B5, the VHDL simulator updates the current simulation time (which is the time after taking one time step of size $\Delta t_{QS}$), and at step B6 it posts this to the SB simulator. At this time, also, step A6 is executed such that any changes in the SB outputs since the most recent time point (which in this case was t=0) are posted to the VHDL simulator. If the VHDL outputs have changed (such as because of an electronic event taking place), these are posted, along with the event time, to the SB simulator (step B7). The postings pursuant to steps A6, B6 and B7 are represented by the double-headed arrow 330 in FIG. 5.

It will be noted that, for the very first integration step of the SB simulator, the outputs must be compared with some previous outputs; this can be accomplished by calculating the first (SB) simulator's outputs at t=0, and then comparing subsequent outputs with the t=0 outputs to see if there have been any changes. The same technique can be applied to the second (VHDL) simulator.

While the VHDL simulator moves forward, the SB simulator repeatedly checks for new VHDL inputs (step A7). It will be assumed for this example that the outputs of the VHDL simulator do not change before time TT, and thus that the determination in steps A7 and A8 is negative.

If the final simulation time is reached, then at step B8 the method proceeds to step B9 and exits. Otherwise, the method proceeds to step B2, and the loop of steps B2 through B8 repeat until the VHDL simulator catches up to the SB simulator. It will be noted that step B2 in this example has no additional effect the second time it is reached, since the VHDL simulator has already waited for the SB simulator to reach time TT. This changes only when a new target time is defined for the SB simulator, which can happen once the VHDL simulator catches up or when the SB simulator has to back up because of a new output from the VHDL simulator, as in the example of FIGS. 7–10.

Figure 6:
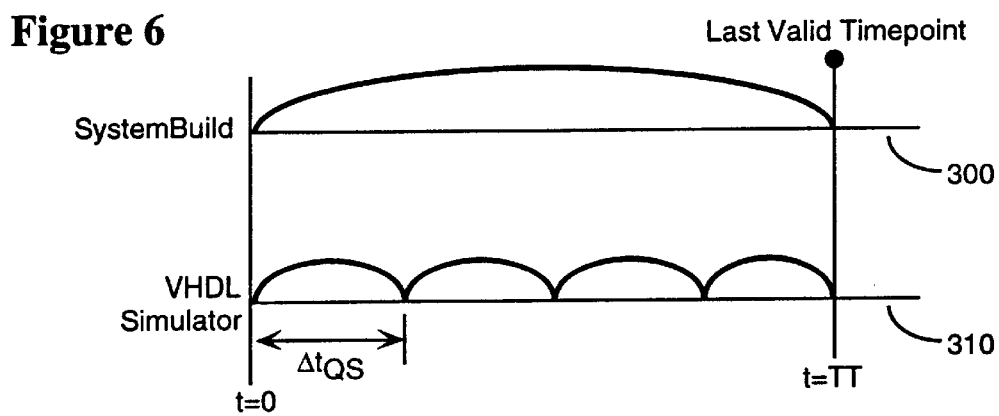

FIG. 6 represents the situation, then, where no new VHDL outputs were generated between times t=0 and t=TT, and so the last valid timepoint has moved up to time TT. In this case, the determination in step A7—which preferably is made at a rate of once every $\Delta t_{QS}$ seconds—is in each case negative. Thus, step A8 is not executed in this example. At step A9, it is determined whether the final simulation time is reached, and if so the method proceeds via step A10 to exit at step A11. Otherwise, the method loops back to step A2, and executes until the final time (which is set by the user) is reached.

Figure 7:
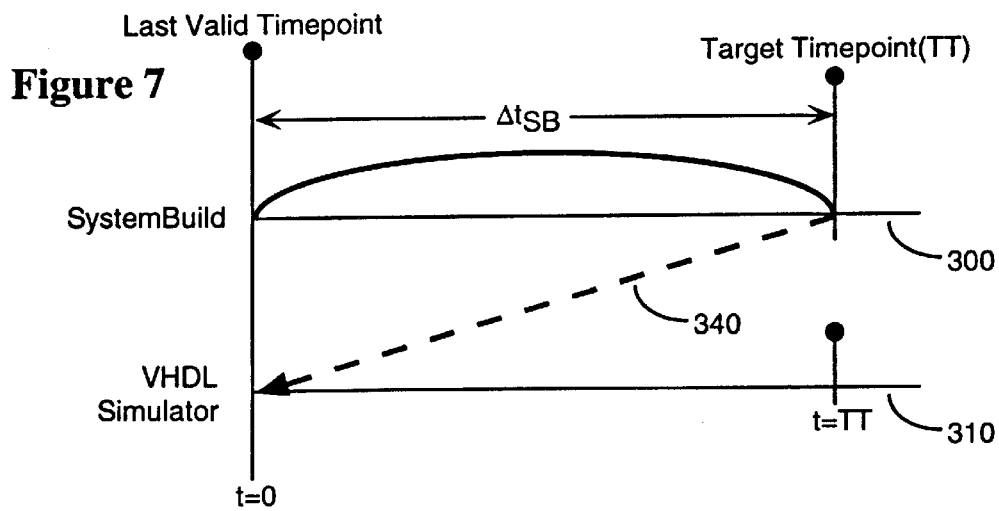

In the example of FIGS. 7 through 10, it will be assumed that the VHDL outputs change for some reason during execution of the VHDL simulation. FIG. 7 represents the same stage in this example as FIG. 4 represented for the preceding example; note that the last valid timepoint is again at t=0, and the posting of the new target timepoint is indicated by arrow 340.

Figure 8:
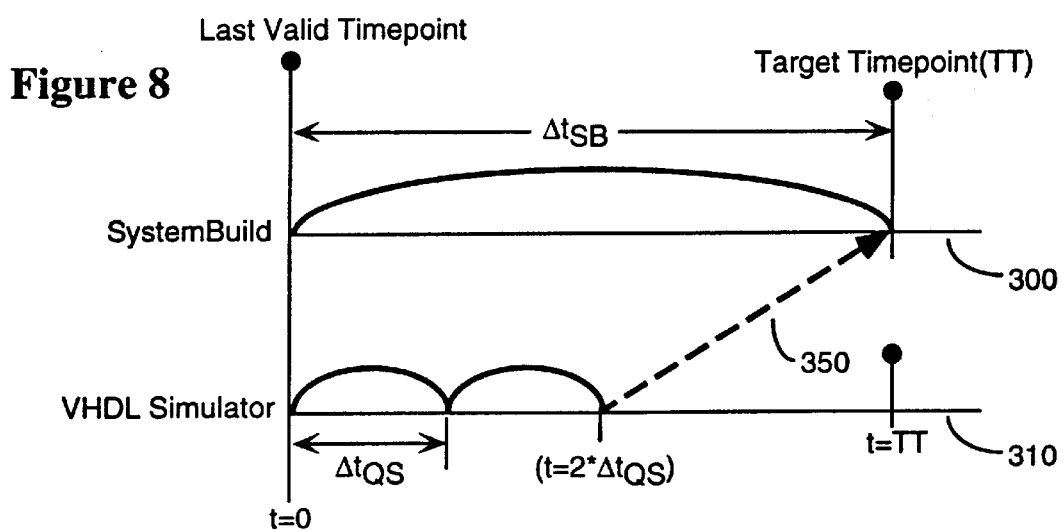

In FIG. 8, the SB simulator has reached the target timepoint TT, and the VHDL simulator has executed its simulation for two, time periods $\Delta t_{QS}$. At step B7, the determination is therefore positive, so that the new outputs and event time are posted to the SB simulator, as indicated by arrow 350 in FIG. 8. (Note that the last valid timepoint is still t=0.) The final simulation time has not been reached, so the method proceeds to step B2.

At the same time, at step A7 the SB simulator, upon receiving the new outputs as indicated in FIG. 8, proceeds to step A8. The new inputs are, in fact, older than the current simulation time, i.e. their associated event time has a value that indicates it occurs prior to the current simulation time t=TT.

Figure 9:
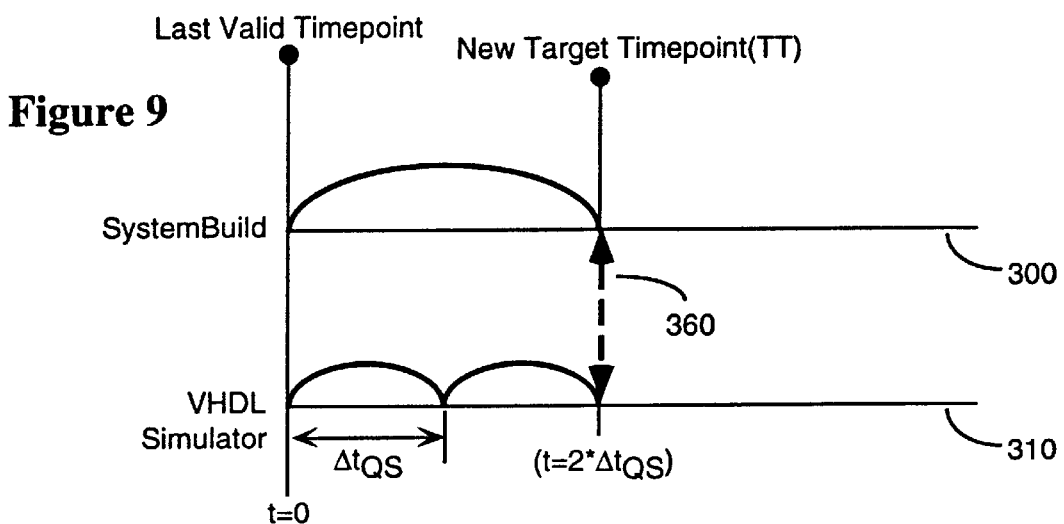

Accordingly, the SB simulator takes the actions indicated in step A8(a)–(g), as follows: it stores the new inputs, and schedules the time associated with those inputs (here, t=2*$\Delta t_{QS}$) as the output evaluation time. The SB simulator's current simulation time is then backed up to this evaluation time, as indicated in FIG. 9 (step A8(c)). At step A8(d), the SB simulator now re-executes its simulation from time t=0, but this time only to time t=2*$\Delta t_{QS}$ instead of to time TT, and the last verified simulation time point is now reset to be this new, current simulation time t=2*$\Delta t_{QS}$. At step A8(e), the last verified time is moved to the current simulation time, the state of the SB simulator is stored at step A8(f), and finally at step A8(g) this last verified simulation time is posted to the VHDL simulator.

Figure 10:
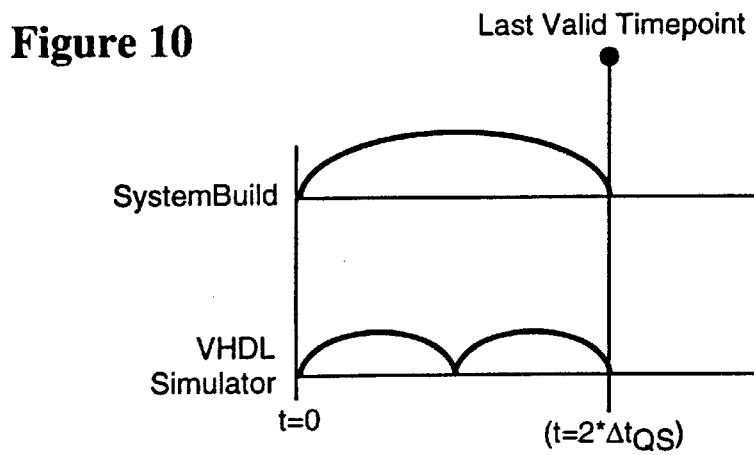

This results in the state represented by FIG. 10, where the two simulators are again synchronized and their valid outputs having been exchanged (indicated by arrow 360 in FIG. 9), such that the last valid timepoint has moved up to t=2*$\Delta t_{QS}$.

The method then proceeds to step A9, at which it is determined that the final simulation time (here, TT) has not been reached, and so proceeds via step A10 to step A2. The further execution of the method is in the same manner as described above, but with time t=2*$\Delta t_{QS}$ as the new last valid timepoint.

If the new outputs generated by the VHDL simulator (represented in FIG. 8) had occurred at the SB simulator's current simulation time of t=TT, then the determination at step A8 would have reflected this, such that steps A8(h)–(k) would have been executed. In this case, the SB simulator advances the last verified simulation time to the current simulation time of t=TT, posts this time to the VHDL simulator, stores the new state of the SB simulation, and applies the new input to the system. If the final simulation time has not been reached, then the method proceeds via step A9 to step A2, as before, and otherwise the method exits.

The above examples presume that, during the time t=0 to t=TT (i.e. before TT is reached), none of the outputs of the SB simulator have changed. If any of these outputs changed in that period of time, then the SB simulator would halt, post these outputs to the VHDL simulator, and set a new "last verified simulation time" and "current simulation time". The VHDL simulator would then run up through the new simulation time, as normal, and the method would begin again from step A1. For this reason, it is preferable, as in the method described, to ensure that the VHDL simulator does not begin its simulation run from the current simulation time until the SB simulator has reached time t=TT or has encountered a new output and posted this to the VHDL simulator as described.

One variation on the invention would allow that the VHDL simulator begin its simulation run before the SB simulator has finished its, but if the SB simulator's outputs change before it reaches its target time, this would require that the VHDL simulator be able to back up, if the outputs of the SB simulator engender a new current simulation time that is before the point up to which the VHDL simulator has already run.

Application of the Invention to a Physical/Electronic Brake System.

The above method applies to a system such as that illustrated in FIG. 3 as follows. The SB module simulates the operation of the physical components of the brake system of FIG. 3, e.g. the disk 250, the calipers 240 and the actuator unit 230. In this simple example, the procession of the SB simulator from time t=0 to a target time TT would represent the rotation of the disk 250 through a given angle A(TT), and perhaps also the application of the brakes, such that the calipers 240 are in contact with the disk 250, as a result of which the disk slows down. Other factors would typically be included in the physical simulation, notably the initial rotational speed of the wheels (and hence disks); the mass of the car; the speed (linear velocity) of the car; and the friction of the wheels with the ground, which affects the rate at which the calipers are able to slow the disks. These factors are all taken into account in producing an SB simulator output of the relevant variables for time t=TT. One of these outputs will be the new rotational rate of the car and the new linear velocity of the car.

The SB simulator outputs from time TT are sent to the electronic simulator, which simulates the action of the electronics 220 in cooperation with the rotation rate sensor 260 and the CPU 210. If no criteria are violated, then the ABS electronics allow the braking to proceed. In this case, the electronic simulator also proceeds to time t=TT, which is reflected in the situation illustrated in FIG. 6.

There may be a violation of ABS criteria, however, such as that the linear velocity of the car is nonzero while the rotational rate of the disk is zero, which would mean that the car is skidding. In this case, the electronics should override the application of the brakes by the driver, to allow the disk to rotate enough to cause the car to stop skidding.

Such a case is reflected in the situation illustrated in FIG. 8, wherein at time t=$\Delta t_{QS}$, a signal is sent to the physical simulator that conditions have changed, reflecting the conditions that the electronic sensors indicate that the car is skidding, and so new outputs are sent to the physical simulator which cause a slight release of the calipers 240. The physical simulator must then back up to simulate forward from this new time t=$\Delta t_{QS}$, and the process is repeated, as discussed above in connection with FIGS. 9–10.

As noted above, the method of the invention takes it as given that one of the simulators, here the electronic (VHDL) simulator, cannot back up, i.e. cannot recover a state from an earlier time than its current simulation time. The other simulator, here the physical (SB) simulator, can back up, and as is clear from the discussion of FIGS. 4–10 above. In principal, an electronic simulator could back up, but since there are on the order of millions of gates in a typical integrated circuit, simulating the operation of all of these gates involves enormous numbers of variables, and accordingly requires large amounts of memory and is very computation-intensive. Generally, the amount of processor power and storage necessary to back up is prohibitive, so as a practical matter a commercially available electronic simulator such as the VHDL simulator will not be able to back up.

The physical (SystemBuild) simulator, by way of contrast, may need to deal with thousands, or fewer, rather than millions of variable values, and thus will typically be able to back up. In one millisecond, it may be practical to save five to ten states for such a simulator.

In the above example, also, the physical (SB) simulator interval $\Delta t_{SB}$ was taken as larger than the interval $\Delta t_{QS}$ for the electronic (QuickSim II) simulator; again, this will be typical for practical applications, though in principle the physical simulator interval could be smaller than the electronic simulator interval.

Given the above pseudocode and discussion of the method, it is a straightforward matter for a practitioner in the art to produce the necessary code for his or her particular system, using otherwise conventional simulation programs.

Practical applications for the invention include the simulation of any electronically controlled physical devices, such as disk drives, hydraulics, vehicle or airline instrumentation, and so on. The invention is in general applicable to any system that can be modeled using two simulators that interact with one another, where the simulations can proceed semi-independently, but at least one simulator can back up to accommodate changes in outputs from the other simulator. The invention may further be expanded to multi-simulator settings.

Although the invention has been described primarily in terms of a physical simulator interacting with an electronic simulator, it is generally applicable to the simulation of any two systems that must interact somehow, and is particularly useful where a first such simulator takes large time steps in its execution, and the second such simulator takes smaller steps, and where the first system is able to back up its simulation if necessary, and the second is not.

Appendix A
PC INTERFACE FUNCTIONS

The current architecture of the IPC library for the SystemsBuild process consists of three hierarchical layers as in Diagram 1 below. Top level functions are prefixed with "rti" and the functions in that layer call functions in the soc_ layer. Functions in the soc_layer are prefixed with "soc" and call UNIX socket communication functions.

Diagram 1
System Build IPC Library Architecture

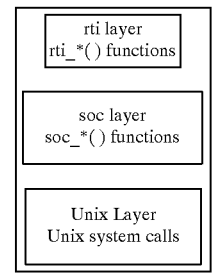

RTI_NTERF.*FILES

Description of Functions in Library
rti_pop_input
    Initializes a set of global variables.
rti_push_input
    Saves the message from other process in a set of global variables. Ideally, this should be some sort of queue/stack to hold dynamically varying number of messages.
rti_write_output
    This function sends a given message to a designated process.
rti_read-input
    This function checks the availability of a message from another process and if there is a message, it fetches the message.
rti_init
    A process other than the router calls this function to request a connection between itself and the router to be established. Function returns a pointer to a structure which holds information concerning the socket descriptor, name of the process which requested the connection and the name of the router.
rti_terminate
    This function closes any socket for which the user can provide a valid socket descriptor.

Specification of Functions in Library
Global variables
    struct route { /* actually, a typedef statement is employed
        to define route */
        int this_end; int other_end;
        int socket;
    };
    route *where;
int rti_pop_input(where, t)
    where->other_end: source process for the input message
        double t: time tag for the message
int rti_push_input(where, info_number, time, attribute, tstore)
    where->other_: end source process for the message int
        info_: number type of the message double time: time tag for the message double attribute: value of the input double tstore: last verified simulation time for the message sender process
int rti_write_output(where, info_number, time, output, tstore)
    where->socket=socket descriptor
    where->this_end=process_1 /* the process calling this function */ where-other_end=process_2 /* the destination process for the message */
int info_number={PINIT, VALID} /* message might be for initialization or for normal data exchange */ Returns 0 if write attempt is unsuccessful and 1 if message is successfully delivered.
integer info_number, double time, output, and tstore make up the message.
int rti_read_input(where, info_number, time, input, tstore)
    where->socket=socket descriptor
    where->this_end=process_1 /* the process calling this function */
    where->other_end4=process_2 /* the originating process for the message */
    int info_number={PINIT, VALID} /* message might be for initialization or for normal data exchange */
    returns 0 if no message is available returns 1 if a message is fetched and places the message contents in memory locations pointed by integer pointer info_number and double pointers time, input, and tstore.
route *rti_init(this_end)
    int this_end: name of the process that attempts to establish a socket connection to router.
    upon successfully connecting to the router, returns a pointer to a structure of type route.
    if connection can not be established, returns a 0.
int rti_terminate(where)
    where->socket=socket descriptor.
int rti_write_double(where, module_number, info_number, attribute)
int rti_read_double(where, module_number, info_number, attribute)
int rti_write(where, module_number, info_number, att_number)
int rti_read(where, module_or _group, new_state_or_command, att_number)

SOC_LINK.*FILES

Description of Functions in Library soc_inform
    This function prints a message pointed by a pointer passed from the calling routine to standard output.
soc_hookup
    This function establishes a connection with router.
soc_hangup
    Closes the connection to router and discards any pending data.
soc_sendmessage
    This function writes the message by the calling process to a designated socket. I/O type is blocking.
soc_getmessage
    This message reads the message available at a given socket. I/O type is blocking.
soc_pollmessage
    Checks to see if there is a message at any of the open sockets for the process calling. If there is a message, it does fetch the message. I/O type is non-blocking.
sock_checkmessage
    Has the same functionality as soc_pollmessage, however, a timeout value for the polling can be specified.

Specification of Functions in Library
void soc_inform(buf, io)
    char *buf; /* pointer to the message string */
    int io; /* a flag indicating if a process is sending or receiving a message */
int soc_hookup()
    returns a socket descriptor for the socket opened for communication with the router.
void soc_hangup(sd)
    int sd; /* socket descriptor for the socket to be closed */
void soc_sendmessage(sd, buf0, buf1, buf2, buf3, buf4)
    int sd; /* socket descriptor for the socket for which the message is sent */char buf0, buf1, buf2, buf3, buf4; /* message content holders */
void soc_getmessage(sd, buf).
    int sd; /* socket descriptor for the socket where the message is available */ char *buf; /* pointer to the character array which will hold the message */
int soc_pollmessage(sd, buf)
    int sd;
    char *buf;
    returns a 1 if there is a message; otherwise, returns a 0
int soc_checkmessage (sd, buf, timeout)
    int sd;
    char *buf;
    int timeout;
    returns a 1 if there is a message; otherwise, returns a 0

Appendix B

| PROTOTYPE IPC ROUTER AND ASSOCIATED FUNCTIONS |
| --- |
| DEF.H FILE |

```
#ifndef DEF
#define DEF
/* defines for the system */
#include ". . . /common/router_machine.h"
#define QUEUE_LENGTH 4    /* Number of connections to backlog*/
#define ROUTER_PORT 6500
#define WORD 20
#define BUFSIZE 1024
#define FIFO_SZ 3
#define RWUSER 0600
/* expanded message structure: messages are now bigger than
 * 5 bytes. Most programs zero out any bytes beyond 5,
 * so the new protocol shouldn't matter, since byte [6],
 * the length-of-additional-data field will be zero.
 */
/* message structure: MSG_LENGTH bytes
 * byte 0: destination process number
 * byte 1: function
 * byte 2: topic
 * byte 3: value
 * byte 4: sending process number
 * byte 5: additional bytes used
 * byte 6 to byte [5]+6: valid data
 * byte [5]+7 to byte 63: don't care (should be zero)
 */
#define OK 1
#define NAK 2
/* define process numbers for byte 0 */
/* numbers 1 to 127 are valid */
#define PINIT       126
#define SLAVE        1
#define SLAVE1       1
#define SLAVE2       6
#define MONITOR      2
#define MONITOR1     2
#define MONITOR2     3
#define SIM1         4
#define SIM2         5
#define ROUTER     127
/* define messages for byte 1, transaction functions */
```

Appendix B-continued

PROTOTYPE IPC ROUTER AND ASSOCIATED FUNCTIONS

```
#define DDE_INIT 1
#define DDE_TERMINATE 2
#define DDE#REQUEST 3
#define DDE_ADVISE 4
#define DDE_POKE 5
#define DDE_DATA 6
#define DDE_ACK 7
#define DDE_UNADVISE 8
/* define NAK error codes */
#define NAK_ERROR 0
#define MAK_BUSY 1
/* define messages for byte 2, topic values */
/* all machines support these */
#define STATUS 1
/* master */
#define ROUTER_CONNECTIONS 9 /* how many connections are
open */
#define EMPTY      0
#define NONEMPTY   1
#define BUSY       2
#define FULL       3
/* define commands */
#define DISPLAY 0
#define EXIT    1
#define INIT    2
#define ACKN    3
#define VALID   4
/* conversion factor */
#define ATOFC 100.0
#endif
                     ROUTER.H FILE /* structure for linked list of sockets */
typedef struct Unit {
   char number;
   int sd;
   struct Unit *next;
   struct Unit *prev;
} unit;
                     ROUTER.C FILE /* this will be a master type process. It creates a socket
 * and responds to messages from the slave server.
 */
#include <stdio.h>
#include <sys/types.h>
#include <sys/socket.h>
#include <signal.h>
#include <sys/time.h>
#include <netdb.h>
#include <netinet/in.h>
#include "DEF.h"
#include "router.h"
#include ". . . /common/soc_link.h"
/* linked list of sockets */
unit *head;
/* initialize the linked list */
void initList ()
{
   head=(unit *)malloc(sizeof(unit));
   head->prev = head;
   head->next = head;
   head->number = 0;
};
void remove_unit(aUnitp)
unit *aUnitp;
{
   aUnitp->prev->next = aUnitp->next;
   aUnitp->next->prev = aUnitp->prev;
   /* sd = 0 only occurs for head, and is not a socket */
   if (aUnitp->sd != 0)
      {
      close (aUnitp->sd);
      };
   free(aUnitp);
}
/* add a socket to the linked list */ int add(sd, number)
int sd; /* the socket */
char number; /* 1 - 127, defined process */
{
   if ((getsd(number)==0)&&(number>0)) {
      unit *temp;
      temp = (unit *)malloc(sizeof(unit));
      temp->next = head->next;
      temp->prev = head;
      head->next = temp;
      temp->sd = sd;
      temp->number = number;
      return 0;
   } else {
      printf ("Router: not a valid process number/n");
      return 1;
   };
};
/* interrupt handler */
int onintr()
{
   unit *index;
   unit *next_one;
   next_one = head->next;
   while(next_one != head)
      {
      index = next_one;
      next_one = index->next; /* save pointer because
      index WI11 be free()'d */
      remove_unit(index);
      }
   exit()
}
getSD (number)
char number;
{
   unit *index;
   for (index=head->next; index.!=head; index=index->next)
      {
      if (index->number =≤ number)
         {
         return index->sd;
         }
      }
   return 0;
}
void process(buf, ns)
char *buf;
int ns;
{
   unit *index;
   char rbuf[256];
   int sd;
   if (buf[0]!=ROUTER)
      {
/*       printf("Router: forwarding message. ");*/
      sd = getSd(buf[0]);
      if (sd != 0)
         {
         soc_inform(buf,0);
         write(sd,buf,MSG_LENGTH);
         } else {
         printf("Router: unknown destination ");
         soc_sendmessage(ns,buf[4]
         DDE_ACK,NAK,NAK_ERROR, ROUTER);
         }
      } else {
      /* message for the router */
      switch (buf[1])
         {
         case DDE_INIT:
            if(add(ns,buf[4])==0)   {
               printf("Router: adding connection ");
               soc_sendmessage(ns,buf[4],DDE_ACK,OK,O,ROUTER);
            } else {
               printf("Router: connection refused ");
```

Appendix B-continued
PROTOTYPE IPC ROUTER AND ASSOCIATED FUNCTIONS

```
              soc_sendmessage (ns,buf[4],DDE_ACK,NAK,NAK_
                 ERROR,ROUTER):
            }
            break;
          default:
            printf("Router: unknown message type ");
            break;
        };
      };
    };
    main()
    {
      int ns;
      char buf[256],hstnm[256];
      int fromlen;
      struct hostent *hp;
      struct sockaddr_in sin;
      atruct sockaddr client_sa;
      int sd, on;
      fd_set fdset;
      unit *index;
      unit *next_one;
      initList ();
      /* set up router port */
      sd = socket(AF_INET, SOCK_STREAM, 0);
      strcpy(hstnm,ROUTER_MACHINE);
      hp = gethostbyname(hstnm);
      bzero((char *)&sin, sizeof(sin));
      bcopy(hp->h_addr, (char *)&sin.sin_addr,hp->h_length);
      sin.sin_port = ROUTER_PORT;
    sin.sin_family = hp->h_addrtype;
    /* set socket option to allow reuse of local addresses */
    on = 1;
    setsockopt(sd, SOL_SOCKET,SO_REUSEADDR, (char *)&on,
    sizeof(on));
    if (bind(sd, (char *)&sin, sizeof(sin)) ==-1)
        {
        perror("Router: error in bind");
        exit ()
        }
    add(sd, ROUTER);
    /* kill all open sockets on a Ctrl-C */
    signal (SIGNIT,onintr);
    /* or a kill %1 command */
    signal (SIGTERM,onintr);
    listen(sd,QUEUE_LENGTH);
    printf(:Router: available for connections ");
    for (;;)
        {
        /* load the fdset with all sockets */
        FD_ZERO (&fdset);
        for(index=head->next; index?=head; index=index->next)
            {
            FD_SET(index->sd, &fdset);
            }
        /* now select among the various fd's */
        select (getdtablesize(),&fdset,NULL,NULL,NULL);
        next_one = head->next;
        while(next_one != head)
            {
            index = next_one;
            next_one = index->next; /* save pointer in case
            index is free()'d */
            if FD_ISSET(index->sd, &fdset)
                {
                if (index->number ==ROUTER)
                    {
                    ns = accept(index-
                    >sd,&client_sa&fromlen);
                    } else {
                    ns = index->sd; /* socket is already
                    connected */
                    }
                bzero(buf,sizeof(buf));
                switch (read(ns,buf,MSG_LENGTH))
    {
                    case 0: printf("Router: end of file,
```

Appendix B-continued
PROTOTYPE IPC ROUTER AND ASSOCIATED FUNCTIONS

```
                      deleting socket ");
                      remove_unit (index);
                      break;
                    case MSG_LENGTH:
                      soc_inform(buf,1);
                      process(buf,ns);
                      break;
                    default: perror("Router: error in read");
                      onintr(); /* will exit */
                      break;
                    }
                }
            }
        }
    }
```

What is claimed is:

1. A method for scheduling processes of a first simulator and a second simulator, the simulators having cross coupled first and second simulator inputs and outputs, the method being executed by at least one processor pursuant to program instructions of a control program stored in a memory coupled to said at least one processor, the first and second simulators stored as first and second simulation programs, respectively, in said memory and executed by said at least one processor, the method including the steps of:

(1) define an initial state, whereby said first and second simulator outputs are initialized and a verified simulation time (vt) and a first simulator current simulation time ($ct_1$) are set to an initial time value ($t_0$);

(2) select and store a target timepoint (tt) later than said first simulator current simulation time ($ct_1$);

(3) begin execution of said first simulator program using said second simulator outputs as initial first simulator inputs;

(4) update said first simulator outputs by a first step time ($\Delta t_1$) not greater than said target timepoint (tt);

(5) define a second state, whereby said updated first simulator outputs do not equal said first simulator outputs;

(6) define a third state whereby said updated first simulator outputs equal said first simulator outputs;

(7) when said second state occurs store the simulation time at which said first simulator outputs changed as new target timepoint (tt);

(8) when said third state occurs continue updating said first simulator outputs stepwise at step (4) until said first simulator currnt simulation time ($ct_1$) equals said target timepint (tt);

(9) post said updated first simulator outputs and target timepoint (tt) as new second simulator inputs to said second simulator and store a state of said first simulator;

(10) begin execution of said second simulator program using said second simulator inputs, with said verified simulation time (vt) as a current simulation time ($ct_2$) for said second simulator;

(11) update said second simulator outputs by a second step time ($\Delta t_2$) not greater thnm said target timepoint (tt);

(12) define a fourth state, whereby said updated second simulator outputs do not equal said second simulator outputs;

(13) when said fourth state occurs,
   a) store a simulation time at which the second simulator outputs changed as a new target timepoint (tt),
   b) post said changed second simulator outputs and said new target timepoint as new first simulator inputs to said first simulator,
   c) back up said first simulator to said verified simulation time (vt),
   d) generate new values for said first simulator outputs using said new first simulator inputs and said new target timepoint as an ending time for the simulation,
   e) store said new target timepoint as said verified simulation time and as said first simulator current simulation time ($ct_1$), and
   f) continue until said verified simulation time equals a simulation completion time by proceeding to step 2;

(14) continue updating said second simulator outputs stepwise until said second simulator current simulation time ($ct_2$) equals said target timepoint (tt);

(15) store said new target timepoint as said verified simulation time and as said first simulator current simulation time ($ct_1$); and

(16) continue until said verified simulation time equals a simulation completion time by proceeding to step 2.

2. A method for scheduling processes of a first simulator and a second simulator, said simulators having cross coupled first and second simulator inputs and outputs, the method being executed by at least one processor pursuant to program instructions of a control program stored in a memory coupled to said at least one processor, said first and second simulator processes stored as first and second simulation programs, respectively, in said memory and executed by said at least one processor, the method including the steps of:

(1) define an initial state, whereby said first and second simulator outputs are initialized and coupled to said second and first simulator inputs respectively, and a verified simulation time (vt) and a first simulator current simulation time ($ct_1$) are set to an initial time value ($t_0$);

(2) select and store a target timepoint (tt) later than said first simulatuo current simulation time ($ct_1$);

(3) begin execution of said first simulator program using said second simulator outputs as first simulator inputs;

(4) update said first simulator outputs for said target timepoint (tt);

(5) post said updated first simulator outputs and target timepoint (tt) as new second simulator inputs to said second simulator and store a state of said first simulator;

(6) begin execution of said second simulator program using said new second simulator inputs, with said verified simulation time (vt) as a second simulator current simulation time ($ct_2$) for said second simulator process;

(7) update said second simulator outputs by a first step time ($\Delta t_1$) not greater than said target timepoint (tt);

(8) define a second state, whereby said updated second simulator outputs do not equal said initialized second simulator outputs;

(9) when said second state occurs,
   a) store a simulation time at which said second simulator outputs changed as a new target timepoint (tt),
   b) post said changed second simulator outputs and said new target timepoint (tt) as new first simulator inputs to said first simulator,
   c) back up said first simulator to said verified simulation time (vt),
   d) generate new values for said first simulator outputs using said new first simulator inputs and said new target timepoint as an ending time for the simulation,
   e) store said new target timepoint as said verified simulation time (vt) and as said first simulator current simulation time ($ct_1$), and
   f) continue until said verified simulation time equals a simulation completion time by proceeding to step 2;

(10) continue updating said second simulator outputs stepwise at step 7 until said second simulator current simulation time ($ct_2$) equals said target timepoint (tt);

(11) store said target timepoint as said verified simulation time and as said first simulator current simulation time ($ct_1$); and

(12) continue until said verified simulation time equals said simulation completion time by proceeding to step 2.

3. A method for scheduling processes of a first simulator and a second simulator, said simulators having cross coupled first and second simulator inputs and outputs, the method being executed by at least one processor pursuant to program instructions of a control program stored in a memory coupled to said at least one processor, the first and second simulator processes stored as first and second simulation programs, respectively, in said memory and executed by said at least one processor, the method including the steps of:

(1) define an initial state, whereby said first and second simulator outputs are coupled to said first and second simulator inputs and a verified simulation time (vt) and a first simulator current simulation time ($ct_1$) are set to an initial time value ($t_0$);

(2) select and store a target timepoint (tt) later than said first simulator current simulation time ($ct_1$);

(3) begin execution of said first simulator program using said first simulator inputs;

(4) update said first simulator outputs for said target timepoint (tt);

(5) define a second state, whereby said updated first simulator outputs do not equal said initialized first simulator outputs;

(6) when said second state occurs, post said updated first simulator outputs and target timepoint (tt) as new second simulator inputs to said second simulator and store a state of said first simulator;

(7) begin execution of said second simulator program using said second simulator inputs, with said verified simulation time (vt) as a second simulator current simulation time ($ct_2$) for said second simulator;

(8) update said second simulator outputs for said target timepoint (tt);

(9) define a third state wherein said updated second simulator outputs have changed relative to said second simulator outputs as calculated at a most recent preceding time of calculation;

(10) when said third state occurs
   (a) post said changed second simulator outputs and target timepoint as new first simulator inputs to said first simulator;
   (b) back up said first simulator to said verified simulation time,
   (c) generate new values for said first simulator outputs using said new first simulator inputs and said target timepoint as an ending time for the simulation, (d) store said target timepoint as said verified simulation time and as said first simulator current simulation time, and (e) continue at step 2 until a final simulation time is reached; and

(11) store said target timepoint as said verified simulation time and continue at step 2 until said final simulation time is reached.

4. A method for scheduling processes of a first simulator and a second simulator, said simulators having first simulator inputs and second simulator inputs, respectively, the method being executed by at least one processor pursuant to program instructions of a program stored in a memory coupled to said at least one processor, said first and second simulators being implemented as first and second simulation programs, respectively, stored in said memory and executed by said at least one processor, the method including the steps of:

(1) generating initial first simulator outputs based upon said first simulator inputs and initial second simulator outputs based upon said second simulator inputs;

(2) storing an initial time value as a value for both a verified simulation time and a current simulation time, and storing a target timepoint;

(3) beginning execution of said first simulator using said first simulator inputs, with said verified simulation time as a beginning time for the simulation;

(4) generating new first simulator outputs by said first simulator using a simulation time later than said current simulation time by an amount equal to a predetermined first time step not greater than said target timepoint (tt);

(5) when said first simulator outputs have changed relative to said first simulator outputs as calculated at a most recent preceding time of calculation, storing a simulation time at which said first simulator outputs changed as said target timepoint, storing a state of said first simulator and posting said changed first simulator outputs and said target timepoint to said second simulator;

(6) beginning execution of said second simulator using said second simulator inputs, with said verified simulation time as said current simulation time;

(7) generating new second simulator outputs by said second simulator using a simulation time later than said current simulation time by an amount equal to a predetermined second time step not greater than said target timepoint (tt);

(8) when said second simulator outputs have changed relative to said second simulator outputs as calculated at a most recent preceding time of calculation, then storing a simulation time at which said second simulator outputs changed as said target timepoint, and posting said changed second simulator outputs and said target timepoint as new first simulator inputs to said first simulator;

(9) when said target timepoint value has changed in step 8, then (a) backing up said first simulator to said verified simulation time, (b) generating new values for said first simulator outputs using said new first simulator inputs and said target timepoint as an ending time for the simulation, (c) storing said target timepoint as said verified simulation time and as said current simulation time, (d) posting said current simulation time, said verified simulation time and said first simulator output values as new second simulator inputs to said second simulator, and (e) proceeding to step 3;

(10) continuing stepwise at step 7 until said target timepoint is reached and then storing said target timepoint as said verified simulation time and as said current simulation time; and

(11) repeating steps 3 through 10 until a predetermined final simulation time is reached.

5. A system for sequencing an execution of a plurality of subsystem simulators comprising:

(1) at least one central processing units (CPU) including a microprocessor coupled to a memory element for storing a control program, said CPU coupled to an input device for controlling said sequencing, said input device comprising a control and monitor panel for initiating and terminating said sequencing;

(2) a first simulator, said first simulator comprising inputs and outputs;

(3) a second simulator, said second simulator comprising inputs and outputs;

(4) a router for coupling said first simulator inputs and outputs to said second simulator outputs and inputs respectively; and (5) said control program comprising (a) an initiation sequence for initiating execution of said first simulator at an initiation time including defining a first simulator output state, (b) a first execution sequence wherein said first simulator executes a simulation and updates said first simulator outputs, (c) a first halt sequence for halting said first execution sequence at a first halt time, equal to the earlier of a predetermined time and when said first simulator outputs change states, and for storing a state of said first simulator at said first halt time, (d) a first transfer sequence for transferring said first simulator outputs to said second simulator inputs, (e) a second execution sequence wherein said second simulator executes a simulation after said first simulator execution has halted, (f) a second halt sequence for halting said second execution sequence at a second halt time equal to the earlier of said first halt time and when said second simulator outputs change state, (g) a second transfer sequence for transferring said second simulator outputs including said second halt time to said first simulator inputs, (h) a repeat sequence for setting said initiation time equal to said second halt time and restarting said first execution sequence to run at said second halt time until a final simulation time is reached, and (i) a back-up sequence for establishing a verified simulation time wherein said first execution sequence is restarted at a time prior to said second halt time upon said change in state of said second simulator outputs.

6. The sequencing system of claim 5 wherein said time prior to said second halt time is a last verified simulation time, said last verified simulation equal to said initiation time.

7. The sequencing system of claim 5 wherein said first execution sequence further comprises updating said first simulator outputs at a plurality of time intervals between said initiation time and said predetermined time until said first simulator outputs change state.

8. The sequencing system of claim 5 wherein said first transfer sequence transfers first simulator outputs including said first halt time to said second simulator inputs.

9. The sequencing system of claim 5 wherein said second execution sequence further comprises updating said second simulator outputs at a plurality of time intervals between said initiation time and said first halt time until said second simulator outputs change state.

10. The sequencing system of claim 5 wherein said second transfer sequence transfers said second simulator outputs including said second halt time to said first simulator inputs.

11. A method for sequencing an execution of a simulation system comprising at least two subsystem simulators, said simulation system further comprising a first and second simulator having first simulator inputs and second simulator inputs, respectively, the method being executed by at least one processor pursuant to program instructions of a program stored in a memory coupled to said at least one processor, said first and second simulators being implemented as first and second simulation programs, respectively, stored in said memory and executed by said at least one processor, the method comprising the steps of:
- (a) initiating execution of said first simulator at an initiation time including defining a first simulator output state;
- (b) executing a first execution sequence wherein said first simulator performs a simulation and updates said first simulator outputs to said second simulator;
- (c) halting said first execution sequence at a first halt time, equal to the earlier of a predetermined time and when a state of said first simulator outputs change, and storing a state of said first simulator;
- (d) transferring said first simulator outputs to said second simulator inputs;
- (e) executing a second execution sequence wherein said second simulator performs a simulation after said first simulator execution sequence has halted;
- (f) halting said second execution sequence at a second halt time equal to the earlier of said first halt time and a change in state of said second simulator outputs;
- (g) transferring said second simulator outputs including second halt time to said first simulator inputs;
- (h) setting said initiation time equal to said second halt time and restarting said first execution sequence to run at said second halt time until a final simulation time is reached; and
- (i) executing a back-up sequence for establishing a verified simulation time wherein said first execution sequence is restarted at a time prior to said second halt time upon said change in state of said second simulator outputs.

12. The sequencing method of claim 11 wherein said time prior to said second halt time is a last verified simulation time, said last verified simulation equal to said initiation time.

13. The sequencing method of claim 11 wherein said first execution sequence further comprises updating said first simulator outputs at a plurality of time intervals between said initiation time and said predetermined time until said first simulator outputs change state.

14. The sequencing method of claim 11 wherein said transferring first simulator outputs step transfers said first simulator outputs including said first halt time to said second simulator inputs.

15. The sequencing system of claim 11 wherein said second execution sequence further comprises updating said second simulator outputs at a plurality of time intervals between said initiation time and said first halt time until said second simulator outputs change state.

16. The sequencing system of claim 11 wherein said transferring second simulator outputs step transfers said second simulator outputs including said second halt time to said first simulator inputs.

17. A method for scheduling processes of a first simulator and a second simulator, said simulators having first simulator inputs and outputs and second simulator inputs and outputs, respectively, the method being executed by at least one processor pursuant to program instructions of a control program stored in a memory coupled to said at least one processor, said first and second simulators stored as first and second simulation programs, respectively, in said memory and executed by said at least one processor, the method including the steps of:
- (1) initialize said first and second simulator outputs;
- (2) store an initial time value as a value for both a verified simulation time (vt) and as a first simulator current simulation time ($ct_1$);
- (3) store a target timepoint (tt) later than said first simulator current simulation time ($ct_1$) and begin execution of said first simulator program using said second simulator outputs as first simulator inputs;
- (4) update said first simulator outputs for said target timepoint (tt);
- (5) when said updated first simulator outputs do not equal said initialized first simulator outputs, post said updated first simulator outputs and said target timepoint as new second simulator inputs to said second simulator and store a state of said first simulator;
- (6) begin execution of said second simulator program using said second simulator inputs, with said verified simulation time as a second simulator current simulation time;
- (7) generate new second simulator outputs by said second simulator using a simulation time later than said first simulator current simulation time by an amount equal to a predetermined first time step not greater than said target timepoint (tt);
- (8) when said second simulator outputs have changed relative to said second simulator outputs as calculated at a most recent preceding time of calculation,
  - (a) stop said second simulator program,
  - (b) store a simulation time at which said second simulator outputs changed as said target timepoint (tt), and post said changed second simulator outputs and said target timepoint as new first simulator inputs to said first simulator,
  - (c) back up said first simulator to said verified simulation time,
  - (d) using said new first simulator inputs to generate new values for said first simulator outputs using said target timepoint as an ending time for the simulation,
  - (e) store said target timepoint as said verified simulation time and as said current simulation time,
  - (f) post said first simulator current simulation time, said verified simulation time and said first simulator outputs as new second simulator inputs to said second simulator, and
  - (g) continue at step 3 until a predetermined final simulation time is reached;
- (9) stop said second simulator program at said target timepoint (tt);
- (10) post said target timepoint and said second simulator outputs as new first simulator inputs to said first simulator;

(11) update said verified simulation time to said target timepoint (tt); and

(12) continue at step 3 until said predetermined final simulation time is reached.

18. A method for scheduling processes of a first simulator and a second simulator, said simulators having first simulator inputs and outputs and second simulator inputs and outputs, respectively, the method being executed by at least one processor pursuant to program instructions of a control program stored in a memory coupled to said at least one processor, said first and second simulators stored as first and second simulation programs, respectively, in said memory and executed by said at least one processor, the method including the steps of:

(1) initialize said first and second simulator outputs;

(2) store an initial time value ($t_0$) as a value for both a verified simulation time (vt) and as a first simulator current simulation time ($ct_1$);

(3) store a target timepoint (tt) later than said first simulator current simulation time ($ct_1$) and begin execution of said first simulator program using said second simulator outputs as first simulator inputs;

(4) update said first simulator outputs for said target timepoint (tt);

(5) when said updated first simulator outputs do not equal said initialized first simulator outputs, post said updated first simulator outputs and target timepoint as new second simlulator inputs to said second simulator and store a state of said first simulator;

(6) begin execution of said second simulator program using said second simulator inputs, with said verified simulation time as a second simulator current simulation time;

(7) generate new second simulator outputs by said second simulator for said target timepoint (tt);

(8) when said second simulator outputs have changed relative to said second simulator outputs as calculated at a most recent preceding time of calculation, (a) stop said second simulator program, (b) post said changed second simulator outputs and said target timepoint as new first simulator inputs to said first simulator, (c) back up said first simulator to said verified simulation time, (d) generate new values for said first simulator outputs using said changed second simulator outputs as new first simulator inputs and said target timepoint as an ending time for the simulation, (e) store said target timepoint as said verified simulation time and as said first simulator current simulation time, (f) post said first simulator current simulation time, said verified simulation time and said first simulator output values as new second simulator inputs to said second simulator, and (g) continue at step 3 until a predetermined final simulation time is reached;

(9) stop said second simulator program at said target timepoint (tt);

(10) post said target timepoint and said second simulator output values as new first simulator inputs to said first simulator;

(11) update said verified simulation time to said target timepoint (tt); and

(12) continue at step 3 until said predetermined final simulation time is reached.

* * * * *